United States Patent
Fischer et al.

(10) Patent No.: US 10,784,118 B2
(45) Date of Patent: *Sep. 22, 2020

(54) ATOMIC LAYER ETCHING USING A COMBINATION OF PLASMA AND VAPOR TREATMENTS

(71) Applicant: Lam Research Corporation, Fremont, CA (US)

(72) Inventors: Andreas Fischer, Castro Valley, CA (US); Thorsten Lill, Santa Clara, CA (US); Richard Janek, Oakland, CA (US); John Boniface, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/289,428

(22) Filed: Feb. 28, 2019

(65) Prior Publication Data

US 2019/0198345 A1    Jun. 27, 2019

Related U.S. Application Data

(63) Continuation of application No. 15/435,838, filed on Feb. 17, 2017, now Pat. No. 10,256,108.

(Continued)

(51) Int. Cl.
*C23C 16/02* (2006.01)
*C23F 1/00* (2006.01)
(Continued)

(52) U.S. Cl.
CPC .... *H01L 21/31122* (2013.01); *C23C 16/0245* (2013.01); *C23F 1/00* (2013.01);
(Continued)

(58) Field of Classification Search
None
See application file for complete search history.

(56) References Cited

U.S. PATENT DOCUMENTS

| | | | |
|---|---|---|---|
| 5,368,687 A | 11/1994 | Sandhu et al. | |
| 5,389,196 A | 2/1995 | Bloomstein et al. | |

(Continued)

FOREIGN PATENT DOCUMENTS

WO    2016100873 A1    6/2016

OTHER PUBLICATIONS

Younghee Lee et al., "Atomic Layer Etching of Al2O3 Using Sequential, Self-Limiting Thermal Reactions with Sn (acac)2 and Hydrogen Fluoride," American Chemical Society, Jan. 20, 2015, pp. 2061-2070, vol. 9, No. 2, published online, www.acsnano.org.

(Continued)

*Primary Examiner* — Stephanie P Duclair
(74) *Attorney, Agent, or Firm* — Penilla IP, APC (57) ABSTRACT

A method for performing atomic layer etching (ALE) on a substrate, including the following method operations: performing a surface modification operation on a surface of the substrate, the surface modification operation configured to convert at least one monolayer of the substrate surface to a modified layer; performing a removal operation on the substrate surface, to remove the modified layer from the substrate surface, wherein removing the modified layer includes exposing the substrate surface to a metal complex, such that a ligand exchange reaction occurs between the metal complex and converted species of the modified layer; performing, following the removal operation, a plasma treatment on the substrate surface, the plasma treatment configured to remove residues formed from the exposure of the substrate surface to the metal complex, wherein the residues are volatilized by the plasma treatment; repeating (Continued)

the foregoing operations until a predefined thickness has been etched from the substrate surface.

20 Claims, 8 Drawing Sheets

Related U.S. Application Data (60) Provisional application No. 62/302,003, filed on Mar. 1, 2016, provisional application No. 62/438,978, filed on Dec. 23, 2016.

(51) Int. Cl.
| | |
|---|---|
| *C23F 1/12* | (2006.01) |
| *C23F 4/00* | (2006.01) |
| *H01J 37/32* | (2006.01) |
| *H01L 21/02* | (2006.01) |
| *H01L 21/3065* | (2006.01) |
| *H01L 21/311* | (2006.01) |
| *H01L 21/3213* | (2006.01) |

(52) U.S. Cl.
CPC .............. *C23F 1/12* (2013.01); *C23F 4/00* (2013.01); *H01J 37/32009* (2013.01); *H01J 37/32082* (2013.01); *H01L 21/30655* (2013.01); *H01L 21/32136* (2013.01); *B81C 2201/0135* (2013.01); *B81C 2201/0142* (2013.01); *H01J 2237/334* (2013.01)

(56) References Cited

U.S. PATENT DOCUMENTS

| | | |
|---|---|---|
| 5,705,443 A | 1/1998 | Stauf et al. |
| 7,357,138 B2 | 4/2008 | Ji et al. |
| 7,781,340 B2 | 8/2010 | Chen et al. |
| 8,058,179 B1 | 11/2011 | Draeger et al. |
| 2006/0003145 A1 | 1/2006 | Hansen et al. |
| 2008/0023800 A1 | 1/2008 | Holzig et al. |
| 2014/0273492 A1 | 9/2014 | Anthis et al. |
| 2015/0037972 A1 | 2/2015 | Danek et al. |
| 2015/0270140 A1 | 9/2015 | Gupta et al. |

OTHER PUBLICATIONS

Notification of Transmittal of the International Search Report and the Written Opinion issued in International Application No. PCT/US2015/066789, dated Feb. 25, 2016 (8 total pages).

ATOMIC LAYER ETCHING USING A COMBINATION OF PLASMA AND VAPOR TREATMENTS

FIELD OF THE INVENTION

Implementations of the present disclosure relate to atomic layer etching (ALE), and more specifically to ALE of aluminum oxide using a combination of plasma and vapor treatments.

DESCRIPTION OF THE RELATED ART

Conventional techniques of etching material on semiconductor substrates with fine-tuned control over the uniformity and etch rate are limited. For example, reactive ion etch is conventionally used to etch materials on a semiconductor substrate during semiconductor processing and etch rates of materials etched using reactive ion etch are controlled by modulating radio frequency plasma power and chemistry selection. However, a wafer plasma sheath forms at the top of the substrate, and thus ions from the plasma are typically accelerated onto the wafer surface to etch the substrate. This results in an anisotropic, directional etching process, which does not etch vertical and horizontal surfaces of the material at the same rate. In addition, materials subject to conventional etching processes may also be non-uniform. Using conventional techniques often involves specific reactor design and/or modification of feed-gas delivery and exhaustion as well as careful monitoring of temperature distribution of both chamber or reactor walls and an electro-static chuck which may be part of a wafer holder capable of holding the wafer during processing to achieve high etch rate uniformity control, and which can result in less efficient and more costly processing of substrates.

SUMMARY

In accordance with some implementations, a method for performing atomic layer etching (ALE) on a substrate is provided, comprising: (a) performing a surface modification operation on a surface of the substrate, the surface modification operation configured to convert at least one monolayer of the substrate surface to a modified layer; (b) performing a removal operation on the substrate surface, the removal operation configured to remove the modified layer from the substrate surface, wherein removing the modified layer occurs via a ligand exchange reaction that is configured to volatilize the modified layer; (c) performing, following the removal operation, a plasma treatment on the substrate surface, the plasma treatment configured to remove residues generated by the removal operation from the substrate surface, wherein the residues are volatilized by the plasma treatment; (d) repeating operations (a) through (c) until a predefined thickness has been etched from the substrate surface.

In some implementations, performing the surface modification operation includes exposing the substrate surface to a fluorine-containing plasma, wherein the exposure to the fluorine-containing plasma is configured to convert the at least one monolayer of the substrate surface to a fluoride species.

In some implementations, the surface of the substrate includes a metal, metal oxide, metal nitride, metal phosphide, metal sulfide, or metal arsenide; wherein the exposure to the fluorine-containing plasma forms a metal fluoride.

In some implementations, exposing the surface of the substrate to the fluorine-containing plasma includes introducing a fluorine-containing gas into a chamber in which the substrate is disposed, and igniting a plasma.

In some implementations, the exposure to the fluorine-containing plasma is performed at a chamber pressure of about 10 to 500 mTorr, for a duration less than about 15 seconds.

In some implementations, performing the removal operation includes exposing the substrate surface to tin-(II) acetylacetonate (Sn(acac)$_2$) vapor, the exposure to the Sn(acac)$_2$ vapor being configured to exchange acac ligands for fluorine atoms in the modified layer.

In some implementations, exposing the surface of the substrate to the Sn(acac)$_2$ includes introducing the Sn(acac)$_2$ as a vapor into a chamber in which the substrate is disposed.

In some implementations, the exposure to the Sn(acac)$_2$ is performed for a duration of about 1 to 30 seconds.

In some implementations, performing the plasma treatment includes exposing the substrate surface to a hydrogen plasma, the exposure to the hydrogen plasma being configured to volatilize tin, tin fluoride or tin oxide residues on the surface of the substrate.

In some implementations, exposing the surface of the substrate to the hydrogen plasma includes introducing a hydrogen gas into a chamber in which the substrate is disposed, and igniting a plasma.

In some implementations, the exposure to the hydrogen plasma is performed for a duration of about 1 to 30 seconds, typically, about 5 seconds.

In some implementations, operation (a) is performed in a first chamber; operation (b) is performed in a second chamber.

In some implementations, operation (d) is performed in the first chamber.

In some implementations, operation (d) is performed in a third chamber.

In accordance with some implementations, a method for performing atomic layer etching (ALE) on a substrate is provided, comprising: (a) performing a surface modification operation on a surface of the substrate, the surface modification operation configured to convert at least one monolayer of the substrate surface to a modified layer; (b) performing a removal operation on the substrate surface, the removal operation configured to remove the modified layer from the substrate surface, wherein removing the modified layer occurs via a ligand exchange reaction that is configured to volatilize the modified layer; (c) repeating operations (a) and (b) for a predefined number of cycles; (d) performing, following operation (c), a plasma treatment on the substrate surface, the plasma treatment configured to remove residues generated by the removal operation from the substrate surface, wherein the residues are volatilized by the plasma treatment; (e) repeating operations (a) through (d) until a predefined thickness has been etched from the substrate surface.

In some implementations, performing the surface modification operation includes exposing the substrate surface to a fluorine-containing plasma, wherein the exposure to the fluorine-containing plasma is configured to convert the at least one monolayer of the substrate surface to a fluoride species; wherein performing the removal operation includes exposing the substrate surface to tin-(II) acetylacetonate (Sn(acac)$_2$) vapor, the exposure to the Sn(acac)$_2$ vapor being configured to exchange acac ligands for fluorine atoms in the modified layer; wherein performing the plasma treatment includes exposing the substrate surface to a hydrogen plasma, the exposure to the hydrogen plasma being configured to volatilize tin, tin fluoride or tin oxide residues on the surface of the substrate.

In some implementations, the surface of the substrate includes a metal, metal oxide, metal nitride, metal phosphide, metal sulfide, or metal arsenide; wherein the exposure to the fluorine-containing plasma forms a metal fluoride.

in some implementations, the exposure to the fluorine-containing plasma is performed at a chamber pressure of about 10 to 500 mTorr, for a duration less than about 15 seconds; wherein the exposure to the Sn(acac)$_2$ is performed for a duration of about 1 to 30 seconds, typically, about 1 second; wherein the exposure to the hydrogen plasma is performed for a duration of about 1 to 30 seconds, typically about 5 seconds.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Provided herein are methods of performing isotropic atomic layer etching (ALE) of metal oxides (such as aluminum oxide ($Al_2O_3$)) via a ligand exchange mechanism involving a fluorine-containing plasma and a tin-containing etchant. Methods described herein involve modifying a surface of the material to be etched using a fluorine-containing plasma and exposing the modified surface to tin-(II) acetylacetonate (Sn(acac)$_2$) vapor to remove the material in a self-limiting manner. A ligand exchange reaction is sustained in a vapor deposition chamber with Sn(acac)$_2$ vapor without plasma.

Atomic layer etching (ALE) is one approach for atomic scale control of etching behavior. ALE is a type of cycling process. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

ALE may be done by a surface modification operation (i.e., chemisorption by reactive chemistry on a substrate surface) followed by a removal operation. Such operations may be repeated for a certain number of cycles. During ALE, the reactive chemistry and the removal chemistry are delivered separately to the substrate.

FIGS. 1A-1F conceptually illustrate an ALE process sequence, in accordance with implementations of the disclosure.

Figure 1A:
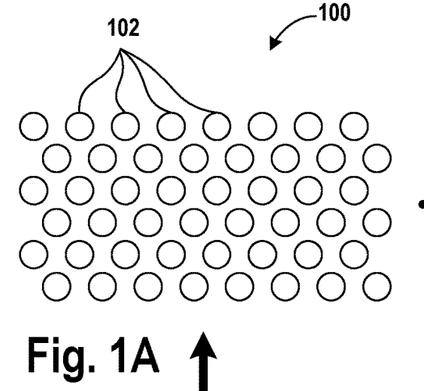
FIGS. 1A-1F conceptually illustrate an ALE process sequence, in accordance with implementations of the disclosure.
Figure 1B:
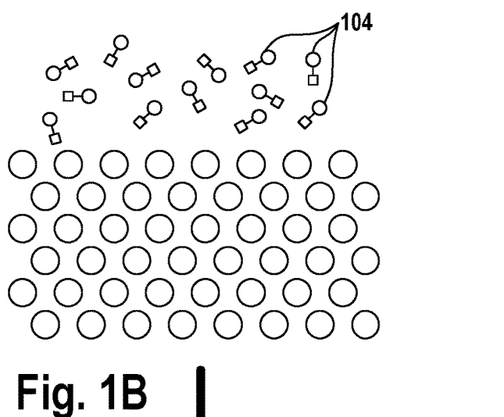
Figure 1C:
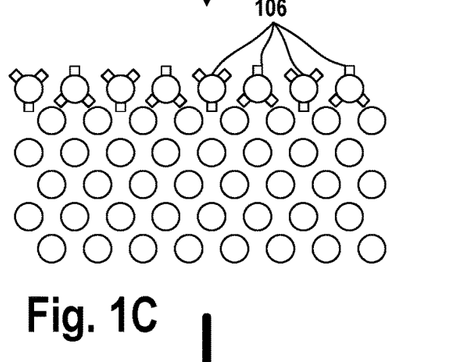

Shown at FIG. 1A is a portion of a surface 100 of a substrate in an unmodified state. The outermost layer 102 of molecules/atoms of the substrate surface 100 are exposed for the ALE process. As shown at FIG. 1B, a surface conversion/modification operation is performed to convert the surface layer of the substrate to a functionalized state. For example, the surface layer is modified by exposure to a surface conversion reactant 104, which may adsorb or chemisorb on the surface. The surface conversion reactant can include molecules or low energy radicals in various implementations, which react with the surface layer atoms to effect the surface conversion step. The resulting surface layer is shown at FIG. 1C consisting of a functionalized outermost layer 106 of molecules to enable subsequent ALE steps. As the reaction is self-limiting, only (or substantially only) the outermost layer of the substrate surface will undergo conversion. In some implementations, this surface modification entails conversion of the surface species to a halide. In some implementations, following the self-limiting surface conversion, the chamber is purged to remove any reaction byproducts or excess surface conversion reactant.

Figure 1D:
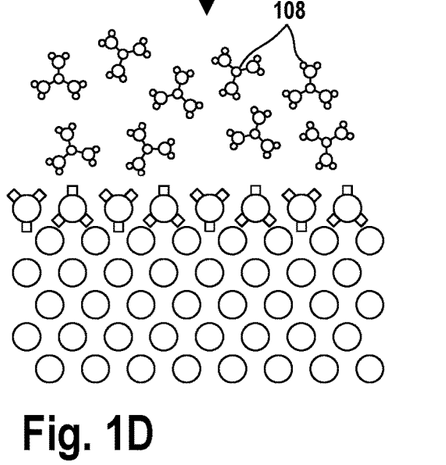
Figure 1E:
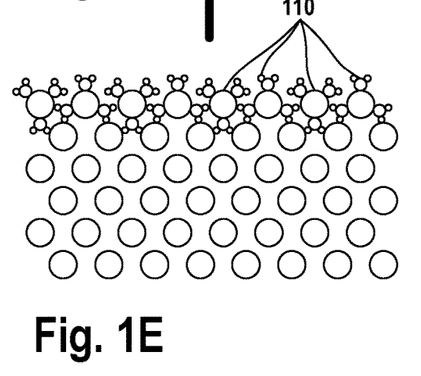

Following the surface conversion operation, then as illustrated at FIG. 1D, a ligand exchange reaction/operation is performed. In the illustrated implementation, the modified surface 106 of the substrate is exposed to a ligand containing reactant 108, which effects a ligand exchange reaction wherein the ligand containing reactant adsorbs on the substrate surface and transfers its ligands to the converted surface species 106 which were formed during the earlier surface modification/conversion operation. The ligands bond with the modified surface layer of molecules/atoms, forming a reaction product consisting of ligand substituted surface species 110 shown at FIG. 1E, which can be released.

Figure 1F:
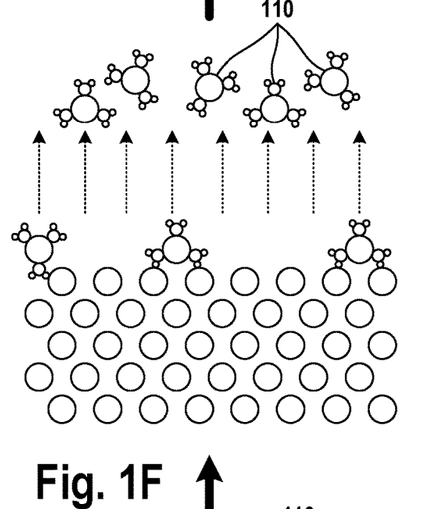

As shown at FIG. 1F, desorption drives removal of the outermost layer of surface species 110 (the reaction product following the ligand exchange operation) from the substrate surface. In some implementations, the release can be achieved by the application of thermal energy, which can be applied simultaneous with the exposure to the ligand containing reactant or in a separate step.

Figure 2:
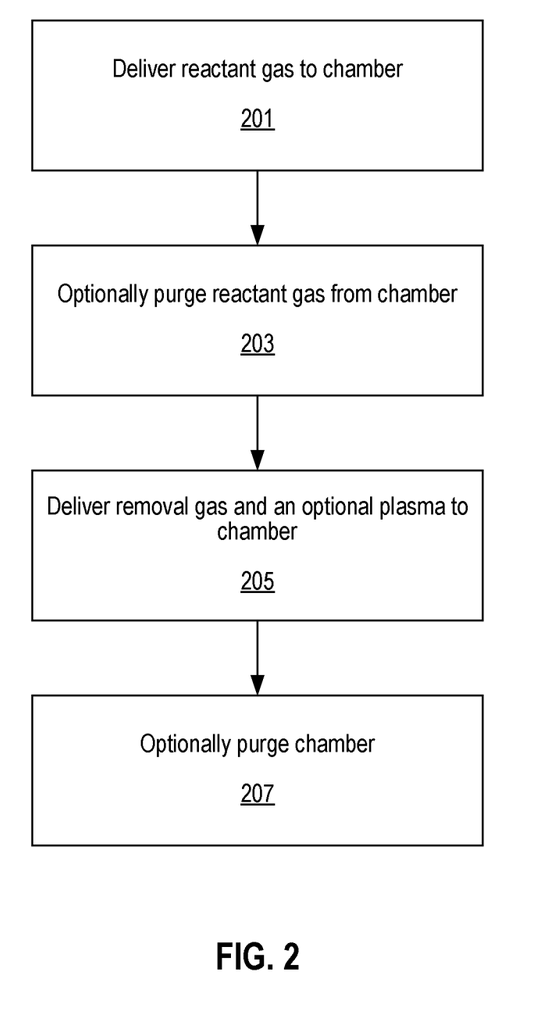
FIG. 2 illustrates a method for an ALE cycle, in accordance with implementations of the disclosure.

The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. Modification may be performed by using a chemisorption mechanism, deposition mechanism, top layer conversion mechanism, or extraction mechanism. The cycle may include certain ancillary operations such as sweeping one of the reactants or byproducts. Generally, a cycle contains one instance of a unique sequence of operations. As an example, FIG. 2 illustrates a method for an ALE cycle, including the following operations: (i) delivery of a reactant gas (operation 201), (ii) optional purging of the reactant gas from the chamber (operation 203), (iii) delivery of a removal gas and an optional plasma (operation 205), and (iv) optional purging of the chamber (operation 207). Further description and examples of ALE are described in U.S. patent application Ser. No. 14/696,254, filed on Apr. 24, 2015 and titled "INTEGRATING ATOMIC SCALE PROCESSES: ALD (ATOMIC LAYER DEPOSITION) AND ALE (ATOMIC LAYER ETCH)," which is incorporated herein by reference for purposes of describing atomic layer etch processes.

Figure 3:
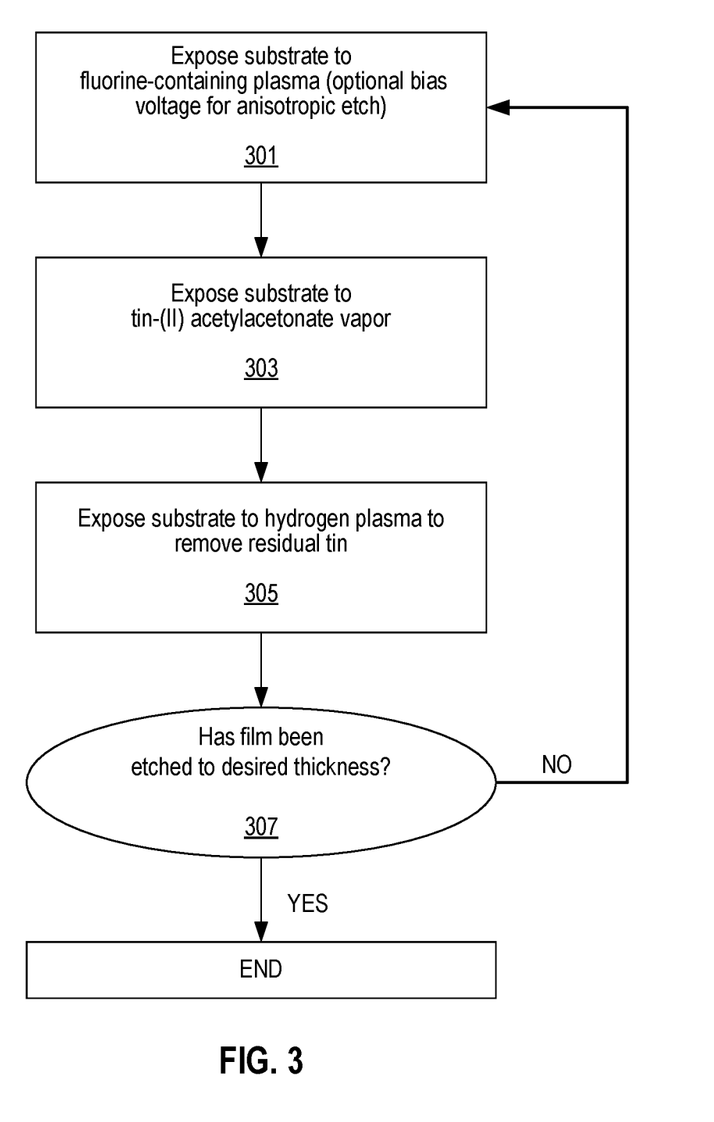
FIG. 3 illustrates a process flow diagram for a method for performing ALE, in accordance with implementations of the disclosure.

A process flow diagram for a method performed in accordance with disclosed embodiments is provided in FIG. 3. During operations 301-307, an inert gas such as an argon gas may be continuously flowed in the background as a carrier gas.

In operation 301, a substrate including a material to be etched is exposed to a fluorine-containing plasma to modify the surface of the substrate.

The fluorine-containing plasma may be generated by introducing a fluorine-containing gas and igniting a plasma. For example, in some embodiments, the fluorine-containing gas may be carbon tetrafluoride ($CF_4$), nitrogen trifluoride ($NF_3$), sulfur hexafluoride ($SF_6$), fluorine ($F_2$), or any fluorine-containing gas. In various embodiments, $CF_4$ may be introduced with $O_2$ to generate an abundance of fluorine ions in the plasma to etch the substrate. In some embodiments, about 35% of the total flow of gases to the chamber to generate the fluorine-containing plasma is $O_2$ gas. Other fluorine-containing gases that include carbon may be used in some embodiments when introduced with another gas to inhibit the formation of a carbide. For example, other fluorine-containing gases may have the formula $C_xH_yF_z$, where x may be any integer greater than or equal to 1, y may be any integer greater than or equal to 0, and z may be any integer greater than or equal to 1. Examples include fluoroform ($CHF_3$) and difluoromethane ($CH_2F_2$). In some embodiments, the fluorine-containing gas may be generated by vaporizing a fluorine-containing liquid.

In some embodiments, the substrate is not patterned. In various embodiments, the substrate may be patterned. The substrate may include a transistor structure which may include an additional gate layer such as a blocking oxide or an etch stop layer. For example, the substrate may include an aluminum oxide layer over a fin of a FinFET transistor. In some embodiments, the substrate may include a 3D NAND structure with a metal oxide etch stop layer at the bottom of trenches formed in the structure such that the metal oxide etch stop layer is the material to be etched. In various embodiments, features on the substrate may have an aspect ratio between about 1.5:1 and about 5:1.

The plasma in operation 301 may be generated in situ or may be a remote plasma. In many embodiments, the plasma is generated in situ to generate an inductively coupled plasma.

In various embodiments, the substrate includes a metal oxide, metal nitride, metal phosphide, metal sulfide, metal arsenide, or metal layer to be etched. Examples include aluminum oxide ($Al_2O_3$) and hafnium oxide. Note that in many embodiments, silicon-containing material (e.g., silicon oxide, silicon nitride, silicon carbide, silicon, etc.) may not be etched using disclosed embodiments, which contributes to achieving etch selectivity particularly when etching a material such as a sacrificial gate oxide layer over a fin on a FinFET transistor structure. Although it will be understood that disclosed embodiments may be used to etch various materials, FIG. 1 will be described with respect to etching aluminum oxide.

In various embodiments, operation 301 may be performed without applying a bias to allow isotropic modification of the substrate surface. Note that although disclosed embodiments may be used to perform isotropic etch, an anisotropic etching process may also be performed using disclosed embodiments by applying a bias during operation 301. The example described herein with respect to FIG. 1 will be described for isotropically etching aluminum oxide.

Without being bound by a particular theory, during operation 301, a metal oxide surface such as an aluminum oxide surface, may be fluorinated by the fluorine-containing plasma isotropically to modify the surface of the aluminum oxide to form aluminum fluoride (e.g., $AlF_3$). One or a few monolayers of the aluminum oxide surface may be modified to form aluminum fluoride. The modification operation may be limited by the depth of diffusion. The substrate may be exposed to the fluorine-containing plasma at a chamber pressure between about 10 mTorr and about 100 mTorr, such as at about 20 mTorr for a duration less than about 15 seconds but greater than 0 seconds.

Note that in some embodiments, after performing operation 301, the chamber housing the substrate may not be purged. In some embodiments, the substrate may be purged.

In operation 303, the substrate is exposed to tin-(II) acetylacetonate ($Sn(acac)_2$) vapor. In various embodiments, $Sn(acac)_2$ may be vaporized in an external vaporizer prior to delivering the vapor to the substrate.

Without being bound by a particular theory, it is believed that when the modified $AlF_3$ surface is exposed to $Sn(acac)_2$ vapor, a ligand exchange reaction occurs such that one acac ligand on $Sn(acac)_2$ replaces one fluorine atom on a $AlF_3$ molecule, forming $AlF_2(acac)$. Additional $Sn(acac)_2$ and/or $Sn(acac)$ may then react with $AlF_2(acac)$ again twice to replace the second and third fluorine atoms with (acac), resulting in $Al(acac)_3$, which is volatile and may thus be etched from the substrate. Since the ligand exchange reaction is theorized to have a faster etch rate in the top monolayer of $AlF_3$ (e.g., the first monolayer exposed to the $Sn(acac)_2$ vapor), the reaction is self-limiting and some tin, tin fluoride, tin oxide, and $Sn(acac)_2$ may begin to build up on the surface of the material to be etched, thus blocking further etching of any modified underlayers of $AlF_3$.

In various embodiments, operations 301 and 303 may be performed in the same chamber. In operation 303, the plasma is turned off and the fluorine-containing gas flow may be turned off prior to turning on the vapor flow. Where the chamber is not purged prior to operation 303, the presence of the fluorine-containing gas without a plasma may not affect the etching mechanism. Rather, the fluorine-containing gas alone may be selected such that it does not react with the material to be etched as a gas and also does not react with the vapor used in operation 303.

Figure 4:
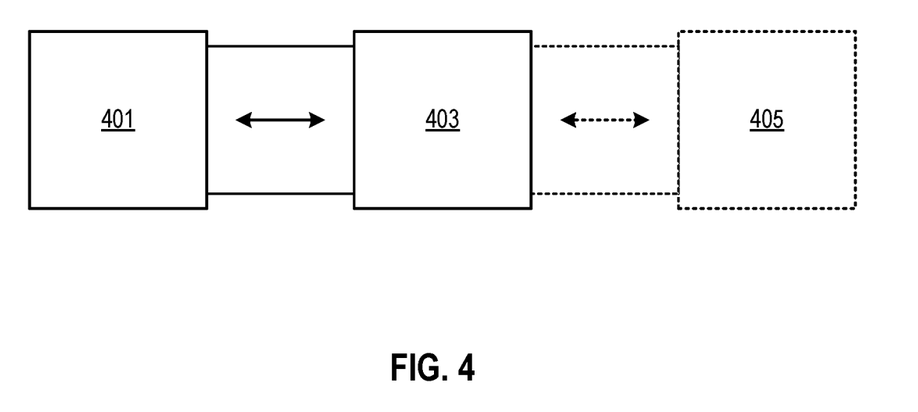
FIG. 4 conceptually illustrates an apparatus having multiple chambers for performing ALE operations, in accordance with implementations of the disclosure.

In some embodiments, operations 301 and 303 may be performed in separate chambers of the same apparatus. FIG. 4 conceptually illustrates an apparatus having multiple chambers for performing ALE operations, in accordance with implementations of the disclosure. In various embodiments, the substrate may be shuttled or moved between a first chamber 401 for exposing to a fluorine-containing plasma in operation 301 to a second chamber 403 for exposing to Sn(acac)$_2$ vapor. In some embodiments, the second chamber 403 is a vapor deposition chamber. In some embodiments, the second chamber 403 is a modified chamber that does not include a plasma source. Note that movement or shuttling of the substrate between chambers may be performed without breaking vacuum.

In alternative embodiments, the substrate may be exposed to another chemical in vapor phase that is selective to the metal fluoride but does not react with the metal oxide. The chemical may include one or more ligands that, when reacted with a metal fluoride, generates a volatile compound including the metal bonded to the ligand.

Operation 303 may be performed for a duration of about 1 second with the temperature of the wafer holder or pedestal holding the wafer set to a temperature of about 200° C. In various embodiments, the chamber pressure at the end of the exposure to the Sn(acac)$_2$ vapor may be about 20 mTorr.

In operation 305, the substrate may be exposed to a plasma treatment. Without being bound by a particular theory, it is believed that operation 305 is performed to volatilize tin, tin fluoride or tin oxide buildup on the surface of the substrate, which can accumulate from performing operation 303. Exposing the substrate to hydrogen may form tin hydrates which are volatile at the chosen substrate temperature, which may then be pumped from the processing chamber. The substrate may be exposed to the plasma treatment for a duration greater than 0 seconds and less than 5 seconds. The duration of plasma exposure may depend on the amount of tin on the surface. For example, in some embodiments, the amount of tin may be determined by evaluating tin lines in an emission spectrum. In some embodiments, the plasma may be turned off when the tin lines in an emission spectrum disappear. In some embodiments, the substrate is exposed to the plasma for about 5 seconds. In some embodiments, the substrate is exposed to the plasma for a duration greater than about 5 seconds. In various embodiments, the plasma treatment may include introducing a hydrogen gas and igniting a plasma. Operation 305 may be performed in the same chamber as in operation 301 and 303. Note that although operation 305 may be performed by exposing the substrate to hydrogen plasma, in some embodiments a different chemistry may be used to remove tin or tin oxide buildup on the surface of the material to be etched. For example, in some embodiments, ammonia (NH$_3$) plasma may be used.

In some embodiments, operation 305 may be performed in a separate chamber. For example, in some embodiments, the substrate may be moved or shuttled to the first station/chamber 401 where operation 301 was performed, or may be moved or shuttled to a third station/chamber 405 to perform operation 305. Note that movement or shuttling of the substrate between chambers may be performed without breaking vacuum.

In operation 307, it is determined whether the amount etched is sufficient to achieve the desired amount to be etched. If the desired remaining thickness has not yet been achieved, operations 301-305 may be optionally repeated. Note that in some embodiments, operation 305 may only be performed every n cycles of performing operations 301 and 303, where n is an integer greater than or equal to 1. Where n is 1, operation 305 is performed in every cycle. In various embodiments, operation 305 is performed in every cycle. In another example, operation 305 may be performed every 2 cycles of performing operations 301 and 303 (where n is 2) such that the following operations may be performed to etch a substrate: (1) exposure to fluorine-containing plasma, (2) exposure to Sn(acac)$_2$ vapor, (3) exposure to fluorine-containing plasma, (4) exposure to Sn(acac)$_2$ vapor, (5) exposure to hydrogen plasma, and (6) repeat (1)-(5).

Figure 5:
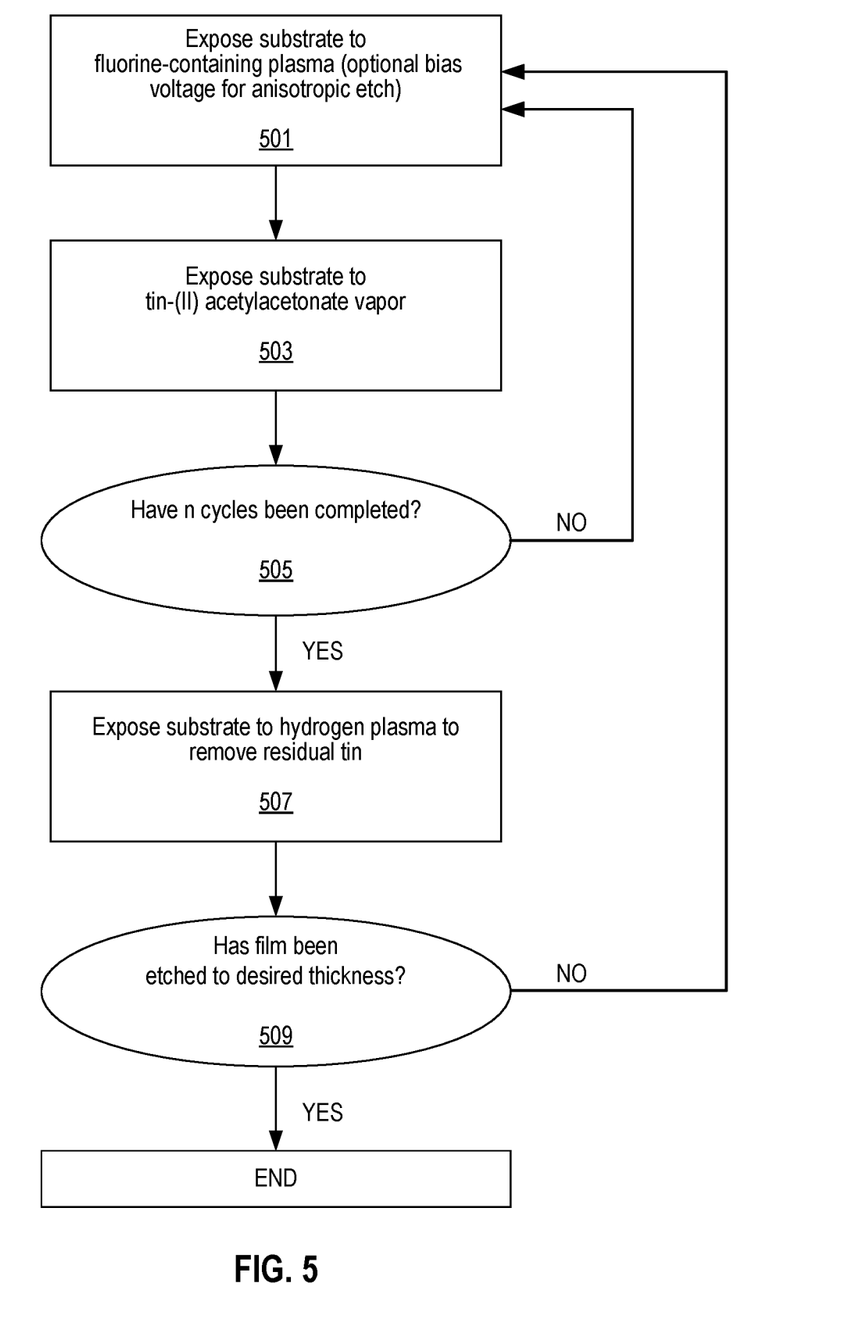
FIG. 5 illustrates a method in accordance with the embodiment of FIG. 3, but with the fluorine exposure and the Sn(acac)$_2$ exposure being repeated until n number of cycles has been reached, in accordance with implementations of the disclosure.

FIG. 5 illustrates a method in accordance with the embodiment of FIG. 3, but with the fluorine exposure (operation 501) and the Sn(acac)$_2$ exposure (operation 503) being repeated until n number of cycles have been reached (operation 505). Then the hydrogen plasma exposure (operation 507) is performed. The entire sequence is repeated until a desired etch amount is achieved (operation 509).

Disclosed embodiments result in highly controlled etching methods with a high degree of uniformity. Disclosed embodiments may be used to perform isotropic etching of various materials and may also be modified to perform anisotropic etching by applying a bias at a bias voltage between about 20 $V_b$ and about 80 $V_b$, such as at about 50 $V_b$.

Various embodiments described herein may be performed in a plasma etch chamber such as the Kiyo, available from Lam Research Corporation in Fremont, Calif. In various embodiments, a substrate may be shuttled between an etching chamber and a vapor chamber without breaking vacuum.

Figure 6:
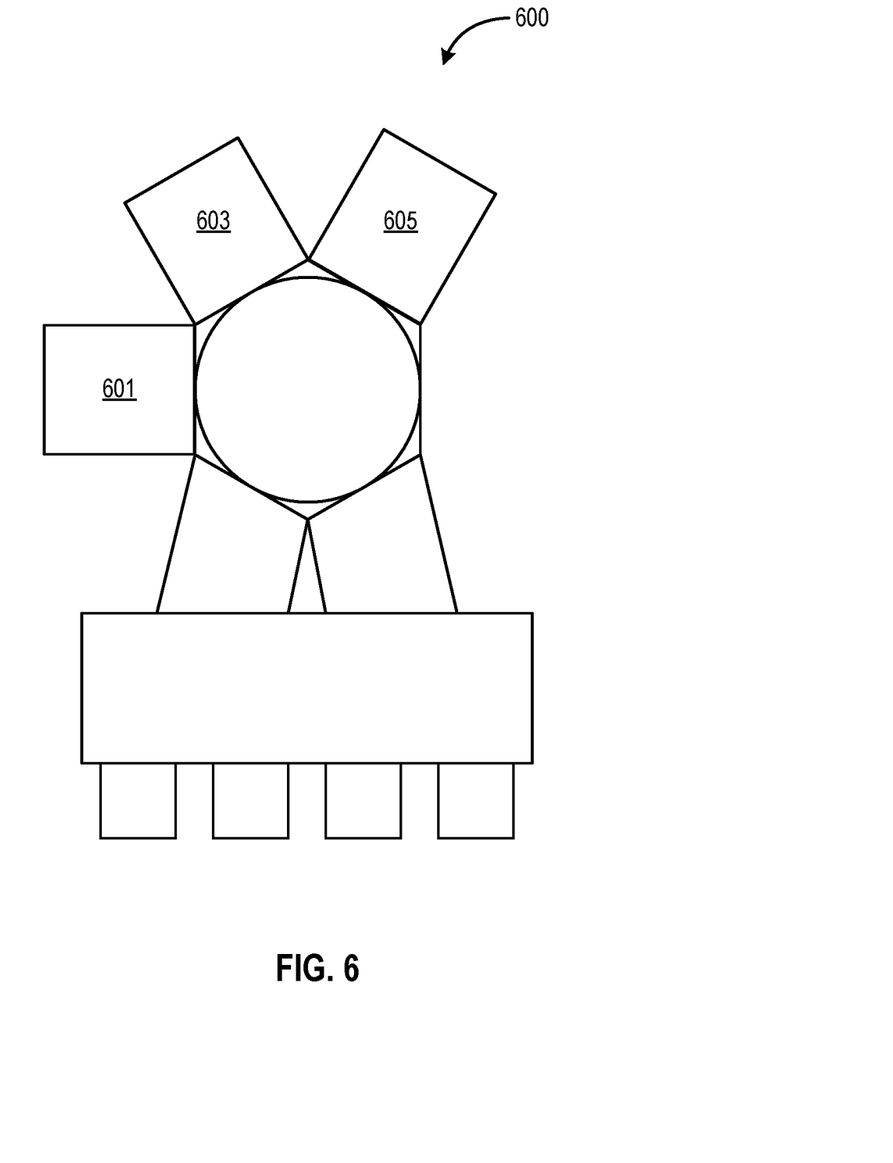
FIG. 6 illustrates a cluster tool 600, in accordance with implementations of the disclosure.

Disclosed embodiments may be performed in any suitable chamber or apparatus, such as the Kiyo® or Flex, both available from Lam Research Corporation of Fremont, Calif. In some embodiments, disclosed embodiments may be performed in a cluster tool, which may contain one or more stations. FIG. 6 illustrates a cluster tool 600, in accordance with implementations of the disclosure. In various embodiments, one station 601 may include a module for etching while another station 603 includes a module for exposing to vapor (e.g., a vapor chamber). In some implementations, a third station 605 includes a module for exposing to a plasma.

Figure 7:
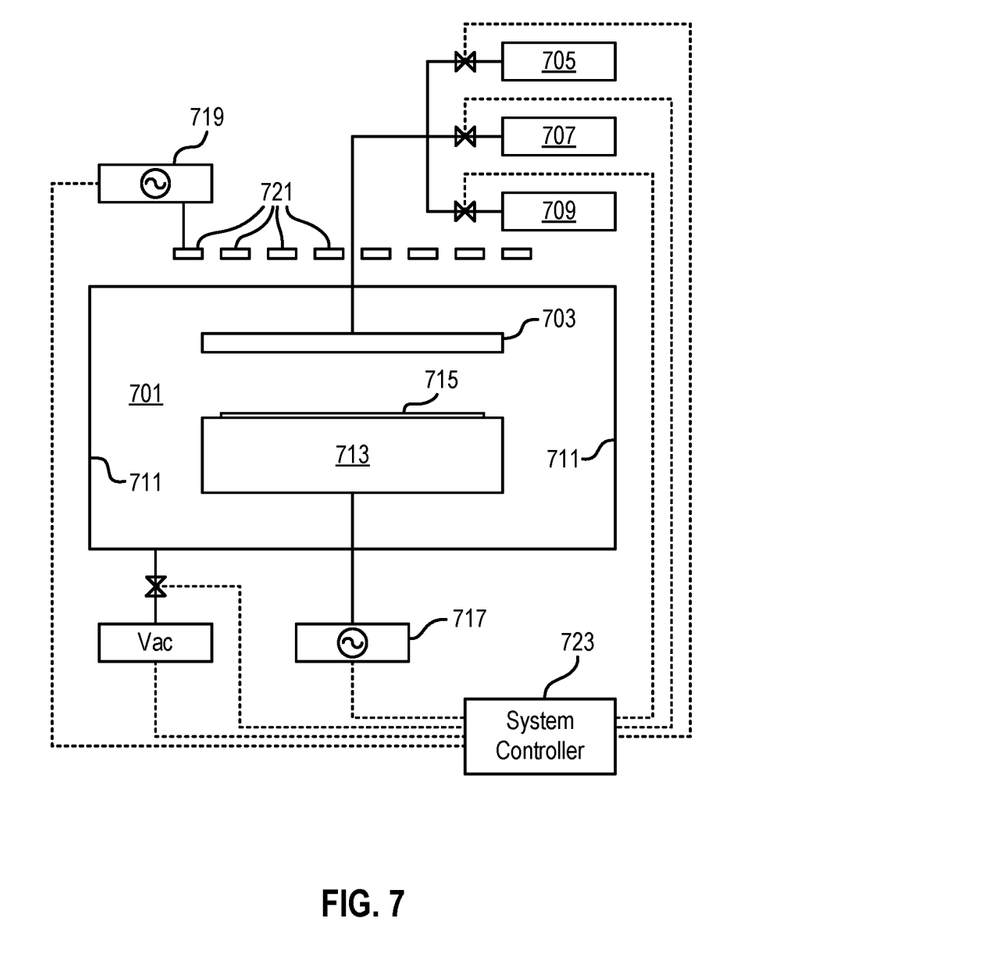
FIG. 7 illustrates an example chamber for performing ALE, in accordance with implementations of the disclosure.

In some embodiments, an inductively coupled plasma (ICP) reactor may be used. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference for the purpose of describing a suitable ICP reactor for implementation of the techniques described herein. Although ICP reactors are described herein, in some embodiments, it should be understood that capacitively coupled plasma reactors may also be used. With reference to FIG. 7, an example etching chamber or apparatus may include a chamber 701 having a showerhead or nozzle 703 for distributing fluorine-containing gases (705), hydrogen gas (707), or Sn(acac)$_2$ vapor (709) or other chemistries to the chamber 701, chamber walls 711, a chuck 713 for holding a substrate or wafer 715 to be processed which may include electrostatic electrodes for chucking and dechucking a wafer and may be electrically charged using an RF power supply 717, an RF power supply 719 configured to supply power to a coil 721 to generate a plasma, and gas flow inlets for inletting gases as described herein. In various embodiments, the chamber walls 711 may be fluorine-resistant. For example, the chamber walls 711 may be coated with silicon-containing material (such as silicon or silicon oxide) or carbon-containing material (such as diamond) or combinations thereof such that fluorine-containing gases and/or plasma may not etch the chamber walls 711. Modification chemistry gases for chemisorption (such as fluorine-containing gases for generating fluorine-containing plasma) and/or vapor exposure (such as Sn(acac)$_2$) may be flowed to the chamber 701. In some embodiments, a hydrogen gas 707 may be flowed to the chamber to generate a hydrogen plasma for removing tin or tin oxide residues. In some implementations, the chamber walls are heated to support wall cleaning efficiency with a hydrogen plasma. In some embodiments, an apparatus may include more than one chamber, each of which may be used to etch, deposit, or process substrates. The chamber or apparatus may include a system controller 723 for controlling some or all of the operations of the chamber or apparatus such as modulating the chamber pressure, inert gas flow, plasma power, plasma frequency, reactive gas flow (e.g., fluorine-containing gas, $Sn(acac)_2$ vapor, etc.); bias power, temperature, vacuum settings; and other process conditions.

Figure 8:
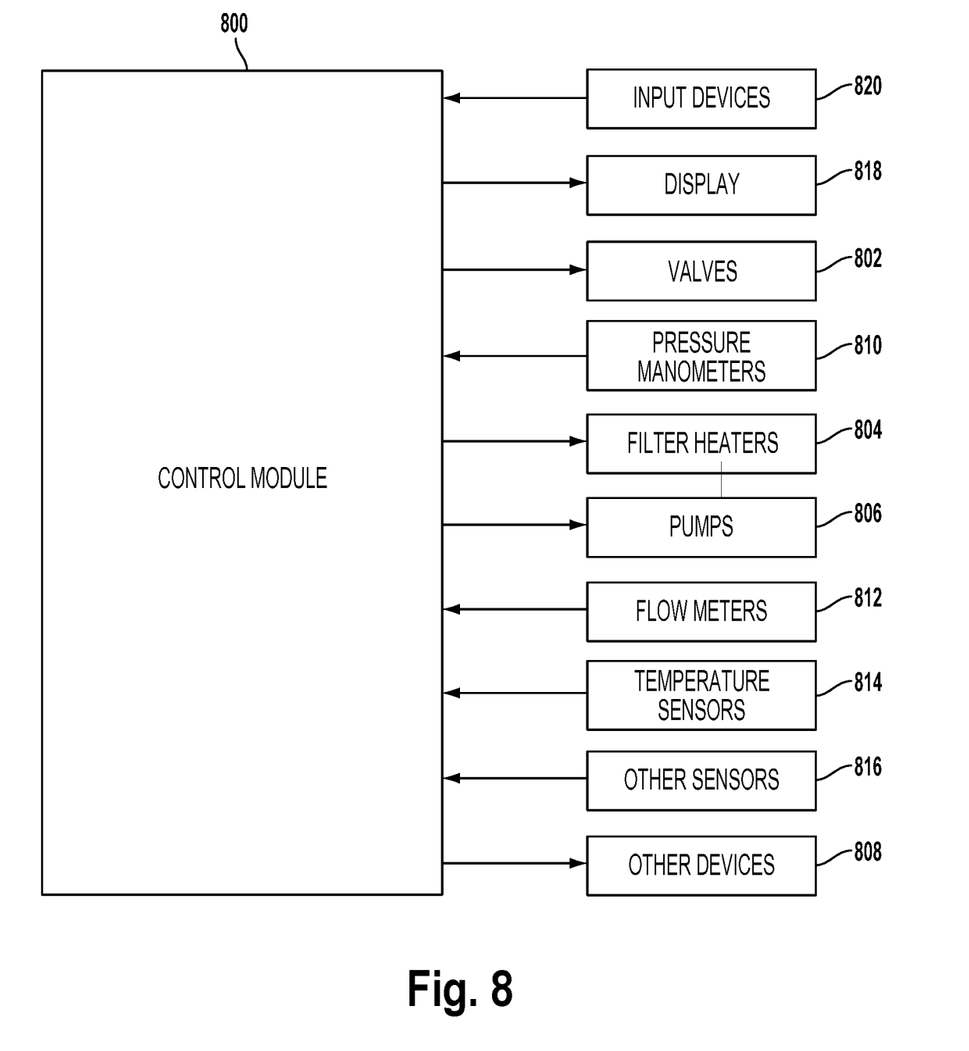
FIG. 8 shows a control module for controlling the systems described above, in accordance with implementations of the disclosure.

FIG. 8 shows a control module 800 for controlling the systems described above, in accordance with implementations of the disclosure. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during reactant delivery and plasma processing. The control module 800 will typically include one or more memory devices and one or more processors.

The control module 800 may control activities of the reactant delivery system and plasma processing apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 800 may also monitor the pressure differential and automatically switch vapor reactant delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for performing atomic layer etching (ALE) on a substrate, comprising:
    (a) performing a surface modification operation on a surface of the substrate, the surface modification operation configured to convert at least one monolayer of the substrate surface to a modified layer;
    (b) performing a removal operation on the substrate surface, the removal operation configured to remove the modified layer from the substrate surface, wherein removing the modified layer includes exposing the substrate surface to a metal complex, such that a ligand exchange reaction occurs between the metal complex and converted species of the modified layer;
    (c) performing, following the removal operation, a plasma treatment on the substrate surface, the plasma treatment configured to remove residues formed from the exposure of the substrate surface to the metal complex, wherein the residues are volatilized by the plasma treatment;
    (d) repeating operations (a) through (c) until a predefined thickness has been etched from the substrate surface.

2. The method of claim 1,
    wherein the surface of the substrate includes a metal, metal oxide, metal nitride, metal phosphide, metal sulfide, or metal arsenide.

3. The method of claim 1, wherein performing the surface modification operation includes exposing the substrate surface to a halide-containing plasma, wherein the exposure to the halide-containing plasma is configured to convert the at least one monolayer of the substrate surface to a halide species.

4. The method of claim 3, wherein exposing the surface of the substrate to the halide-containing plasma includes introducing a halide-containing gas into a chamber in which the substrate is disposed, and igniting a plasma.

5. The method of claim 3, wherein exposing the substrate surface to the halide-containing plasma includes receiving the halide-containing plasma from a remote plasma source.

6. The method of claim 1, wherein performing the removal operation includes exposing the substrate surface to tin-(II) acetylacetonate ($Sn(acac)_2$) vapor, the exposure to the $Sn(acac)_2$ vapor being configured to exchange acac ligands for atoms in the modified layer.

7. The method of claim 1, wherein performing the plasma treatment includes exposing the substrate surface to a hydrogen plasma.

8. The method of claim 7, wherein exposing the substrate surface to the hydrogen plasma includes receiving the hydrogen plasma from a remote plasma source.

9. The method of claim 1, wherein exposing the surface of the substrate to the plasma includes introducing a hydrogen gas into a chamber in which the substrate is disposed, and igniting a plasma.

10. The method of claim 1,
wherein operation (a) is performed in a first chamber;
wherein operation (b) is performed in a second chamber.

11. A method for performing atomic layer etching (ALE) on a substrate, comprising:
  (a) performing a surface modification operation on a surface of the substrate, the surface modification operation configured to convert at least one monolayer of the substrate surface to a modified layer;
  (b) performing a removal operation on the substrate surface, the removal operation configured to remove the modified layer from the substrate surface, wherein removing the modified layer includes exposing the substrate surface to a metal complex, such that a ligand exchange reaction occurs between the metal complex and converted species of the modified layer;
  (c) repeating operations (a) and (b) for a predefined number of cycles;
  (d) performing, following operation (c), a plasma treatment on the substrate surface, the plasma treatment configured to remove residues formed from the exposure of the substrate surface to the metal complex, wherein the residues are volatilized by the plasma treatment;
  (e) repeating operations (a) through (d) until a predefined thickness has been etched from the substrate surface.

12. The method of claim 11,
wherein the surface of the substrate includes a metal, metal oxide, metal nitride, metal phosphide, metal sulfide, or metal arsenide.

13. The method of claim 11, wherein performing the surface modification operation includes exposing the substrate surface to a halide-containing plasma, wherein the exposure to the halide-containing plasma is configured to convert the at least one monolayer of the substrate surface to a halide species.

14. The method of claim 13, wherein exposing the surface of the substrate to the halide-containing plasma includes introducing a halide-containing gas into a chamber in which the substrate is disposed, and igniting a plasma.

15. The method of claim 13, wherein exposing the substrate surface to the halide-containing plasma includes receiving the halide-containing plasma from a remote plasma source.

16. The method of claim 11, wherein performing the removal operation includes exposing the substrate surface to tin-(II) acetylacetonate ($Sn(acac)_2$) vapor, the exposure to the $Sn(acac)_2$ vapor being configured to exchange acac ligands for atoms in the modified layer.

17. The method of claim 11, wherein performing the plasma treatment includes exposing the substrate surface to a hydrogen plasma.

18. The method of claim 17, wherein exposing the substrate surface to the hydrogen plasma includes receiving the hydrogen plasma from a remote plasma source.

19. The method of claim 11, wherein exposing the surface of the substrate to the plasma includes introducing a hydrogen gas into a chamber in which the substrate is disposed, and igniting a plasma.

20. The method of claim 11,
wherein operation (a) is performed in a first chamber;
wherein operation (b) is performed in a second chamber.

* * * * *